(12) United States Patent
Konno

(10) Patent No.: US 11,290,121 B2
(45) Date of Patent: Mar. 29, 2022

(54) SUCCESSIVE APPROXIMATION AD CONVERTER

(71) Applicant: Asahi Kasei Microdevices Corporation, Tokyo (JP)

(72) Inventor: Shota Konno, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 17/163,531

(22) Filed: Jan. 31, 2021

(65) Prior Publication Data

US 2021/0250039 A1   Aug. 12, 2021

(30) Foreign Application Priority Data

Feb. 7, 2020  (JP) .............................. JP2020-020110

(51) Int. Cl.
*H03M 1/12*  (2006.01)
*H03M 1/46*  (2006.01)
*H03M 1/08*  (2006.01)

(52) U.S. Cl.
CPC ......... *H03M 1/462* (2013.01); *H03M 1/0809* (2013.01); *H03M 1/468* (2013.01)

(58) Field of Classification Search
CPC ...... H03M 1/468; H03M 1/462; H03M 1/804; H03M 1/1047; H03M 1/10; H03M 1/68; H03M 1/0678; H03M 1/1245; H03M 1/167; H03M 1/466; H03M 1/00; H03M 1/001; H03M 1/002; H03M 1/06; H03M 1/0639; H03M 1/0697; H03M 1/1057; H03M 1/1004; H03M 1/12; H03M 1/181; H03M 1/66; H03M 1/0658; H03M 1/066; H03M 1/0663; H03M 1/0682; H03M 1/1009; H03M 1/182
USPC .................................. 341/118–121, 155, 156
See application file for complete search history.

(56) References Cited

U.S. PATENT DOCUMENTS

| | | | |
|---|---|---|---|
| 7,379,012 B2 * | 5/2008 | Sutardja ................ | H03M 1/682 341/155 |
| 8,164,495 B2 | 4/2012 | Agi | |
| 9,577,654 B2 * | 2/2017 | Kijima .................. | H03M 1/002 |
| 9,685,973 B2 * | 6/2017 | Liu ......................... | H03M 1/38 |
| 9,923,569 B1 * | 3/2018 | Chen ...................... | H03M 1/10 |
| 9,954,545 B2 | 4/2018 | Haneda | |
| 10,382,049 B1 * | 8/2019 | Hunt-Schroeder .. | G01R 35/007 |

(Continued)

*Primary Examiner* — Linh V Nguyen
(74) *Attorney, Agent, or Firm* — JCIPRNET

(57) ABSTRACT

A successive approximation ADC includes: a comparator generating a judge signal related to an input analog and a reference signals; a SAR successively generating a register signal including a first and a second bit signals based on the judge signal and generating an AD conversion value of the input analog signal; a thermometer decoder switching different thermometer code conversion rules and converting the first bit signal to thermometer codes corresponding to the different thermometer code conversion rules in one AD conversion cycle; a first and a second DA converters respectively converting the thermometer codes to a first analog signal and the second bit signal to a second analog signal; an average value calculator averaging the AD conversion values by the thermometer codes. Two of the different thermometer codes have values that a high-order bit and a low-order bit groups by dividing total bits of the thermometer code equally are exchanged.

8 Claims, 18 Drawing Sheets

(56) References Cited

U.S. PATENT DOCUMENTS

| | | | |
|---|---|---|---|
| 10,432,208 B2 | 10/2019 | Inoue et al. | |
| 10,447,292 B1* | 10/2019 | Price | H03M 1/144 |
| 2011/0260899 A1* | 10/2011 | Snedeker | H03M 1/1047 |
| | | | 341/118 |
| 2012/0154193 A1* | 6/2012 | Chang | H03M 1/145 |
| | | | 341/156 |
| 2017/0201268 A1* | 7/2017 | Sharma | H03M 1/1245 |
| 2019/0229743 A1* | 7/2019 | Fuchs | H03M 1/468 |
| 2020/0343901 A1* | 10/2020 | Etou | H03M 1/466 |

* cited by examiner

|  | [000] | [001] | [010] | [011] | [100] | [101] | [110] | [111] |
|---|---|---|---|---|---|---|---|---|
| C6 | 0 | 0 | 0 | 0 | 0 | 0 | 0 | 1 |
| C5 | 0 | 0 | 0 | 0 | 0 | 0 | 1 | 1 |
| C4 | 0 | 0 | 0 | 0 | 0 | 1 | 1 | 1 |
| C3 | 0 | 0 | 0 | 0 | 1 | 1 | 1 | 1 |
| C2 | 0 | 0 | 0 | 1 | 1 | 1 | 1 | 1 |
| C1 | 0 | 0 | 1 | 1 | 1 | 1 | 1 | 1 |
| C0 | 0 | 1 | 1 | 1 | 1 | 1 | 1 | 1 |

(a)

|  | [000] | [001] | [010] | [011] | [100] | [101] | [110] | [111] |
|---|---|---|---|---|---|---|---|---|
| C6 | 0 | 0 | 0 | 0 | 0 | 0 | 0 | 1 |
| C5 | 0 | 0 | 0 | 0 | 0 | 0 | 1 | 1 |
| C4 | 0 | 0 | 0 | 0 | 0 | 1 | 1 | 1 |
| C3 | 0 | 0 | 0 | 0 | 1 | 1 | 1 | 1 |
| C2 | 0 | 0 | 0 | 1 | 1 | 1 | 1 | 1 |
| C1 | 0 | 0 | 1 | 1 | 1 | 1 | 1 | 1 |
| C0 | 0 | 1 | 1 | 1 | 1 | 1 | 1 | 1 |

| binary value | 000 | 001 | 010 | 011 | 100 | 101 | 110 | 111 |
|---|---|---|---|---|---|---|---|---|
| DNL of 1st decoding method | | C0 2 | C1 3 | C2 -2 | C3 0 | C4 -2 | C5 1 | C6 -2 |
| DNL of 2nd decoding method | | C6 -2 | C5 1 | C4 -2 | C3 0 | C2 -2 | C1 3 | C0 2 |
| INL of 1st decoding method | 0 | 2 | 5 | 3 | 3 | 1 | 2 | 0 |
| INL of 2nd decoding method | 0 | -2 | -1 | -3 | -3 | -5 | -2 | 0 |

FIG. 4

| binary value | 000 | 001 | 010 | 011 | 100 | 101 | 110 | 111 |
|---|---|---|---|---|---|---|---|---|
| average of INL | 0 | 0 | 2 | 0 | 0 | -2 | 0 | 0 |

| | [000] | [001] | [010] | [011] | [100] | [101] | [110] | [111] |
|---|---|---|---|---|---|---|---|---|
| C6 | 0 | 0 | 0 | 0 | 0 | 1 | 1 | 1 |
| C5 | 0 | 0 | 0 | 0 | 0 | 0 | 1 | 1 |
| C4 | 0 | 0 | 0 | 0 | 0 | 0 | 0 | 1 |
| C3 | 0 | 0 | 0 | 0 | 1 | 1 | 1 | 1 |
| C2 | 0 | 1 | 1 | 1 | 1 | 1 | 1 | 1 |
| C1 | 0 | 0 | 1 | 1 | 1 | 1 | 1 | 1 |
| C0 | 0 | 0 | 0 | 1 | 1 | 1 | 1 | 1 |
| thermometer code | | | | | | | | |
| binary code | [000] | [001] | [010] | [011] | [100] | [101] | [110] | [111] |

(b)

| | [000] | [001] | [010] | [011] | [100] | [101] | [110] | [111] |
|---|---|---|---|---|---|---|---|---|
| C6 | 0 | 0 | 0 | 1 | 1 | 1 | 1 | 1 |
| C5 | 0 | 0 | 1 | 1 | 1 | 1 | 1 | 1 |
| C4 | 0 | 1 | 1 | 1 | 1 | 1 | 1 | 1 |
| C3 | 0 | 0 | 0 | 0 | 1 | 1 | 0 | 1 |
| C2 | 0 | 0 | 0 | 0 | 0 | 0 | 1 | 1 |
| C1 | 0 | 0 | 0 | 0 | 0 | 1 | 1 | 1 |
| C0 | 0 | 0 | 0 | 0 | 0 | 1 | 1 | 1 |
| thermometer code | | | | | | | | |
| binary code | [000] | [001] | [010] | [011] | [100] | [101] | [110] | [111] |

FIG. 13

| binary value | 000 | 001 | 010 | 011 | 100 | 101 | 110 | 111 |
|---|---|---|---|---|---|---|---|---|
| INL of 3rd decoding method | 0 | -2 | 1 | 3 | 3 | 1 | 2 | 0 |
| INL of 4th decoding method | 0 | -2 | -1 | -3 | -3 | -1 | 2 | 0 |

FIG. 14

| binary value | 000 | 001 | 010 | 011 | 100 | 101 | 110 | 111 |
|---|---|---|---|---|---|---|---|---|
| average of INL | 0 | -1 | 1 | 0 | 0 | -1 | 1 | 0 |

FIG. 15

| binary value | [000] | [001] | [010] | [011] | [100] | [101] | [110] |
|---|---|---|---|---|---|---|---|
| average of INL | 0 | 0 | 2 | 0 | −2 | 0 | 0 |
FIG. 20
(a)
| thermometer code | | | | | | | | |
|---|---|---|---|---|---|---|---|---|
| C5 | 0 | 0 | 0 | 0 | 1 | 1 | 1 |
| C4 | 0 | 0 | 0 | 0 | 0 | 1 | 1 |
| C3 | 0 | 0 | 0 | 0 | 0 | 0 | 1 |
| C2 | 0 | 1 | 1 | 1 | 1 | 1 | 1 |
| C1 | 0 | 0 | 1 | 1 | 1 | 1 | 1 |
| C0 | 0 | 0 | 0 | 1 | 1 | 1 | 1 |
| binary code | [000] | [001] | [010] | [011] | [100] | [101] | [110] |
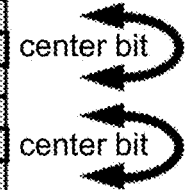
(b)
| thermometer code | | | | | | | | |
|---|---|---|---|---|---|---|---|---|
| C5 | 0 | 0 | 0 | 1 | 1 | 1 | 1 |
| C4 | 0 | 0 | 1 | 1 | 1 | 1 | 1 |
| C3 | 0 | 1 | 1 | 1 | 1 | 1 | 1 |
| C2 | 0 | 0 | 0 | 0 | 0 | 0 | 1 |
| C1 | 0 | 0 | 0 | 0 | 0 | 1 | 1 |
| C0 | 0 | 0 | 0 | 0 | 1 | 1 | 1 |
| binary code | [000] | [001] | [010] | [011] | [100] | [101] | [110] |
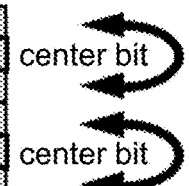
FIG. 21

SUCCESSIVE APPROXIMATION AD CONVERTER

CROSS REFERENCE TO RELATED APPLICATIONS

This application claims the priority benefit of Japanese Patent Application No. 2020-020110, filed on Feb. 7, 2020. The entirety of the above-mentioned patent application is hereby incorporated by reference herein and made a part of this specification.

BACKGROUND

Technical Field

The disclosure relates to a successive approximation AD converter.

Description of Related Art

A successive approximation AD converter is known as an AD converter that converts an input analog signal to a digital signal. The successive approximation AD converter includes a DA converter, a comparator, and a successive approximation logical circuit. As an input of the DA converter, a binary code is converted to a thermometer code.

In general, as a result of comparison between a DA converter using a binary code (a binary DA converter) and a DA converter using a thermometer code (a thermometer DA converter), a differential nonlinear error in the thermometer DA converter is more improved. For example, the reason for this will be described below using DA converters illustrated in FIGS. 16 and 17. FIG. 16 illustrates a DA converter 100 in which three high-order bits are configured by thermometer DA conversion elements and five low-order bits are configured by binary DA conversion elements. FIG. 17 illustrates a DA converter 200 in which all eight bits are configured by binary DA conversion elements.

When it is assumed that "01111111" transitions to "10000000" in binary bits in AD conversion, a change in which a capacitor C4 is connected from a minus side (VREFN) of a reference voltage to a plus side (VREFP) thereof and capacitors C5, C6, and C8 to C12 are connected from VREFP to VREFN occurs in the DA converters 200 illustrated in FIG. 17. This means that a difference between an output value of the DA converter which is expressed by three high-order bits "011" and five low-order bits "11111" and an output value of the DA converter which is expressed by three high-order bits "100" and five low-order bits "00000" is generated as an error from an ideal analog value corresponding to one code. This difference is equivalent to a differential nonlinear error. Accordingly, the total sum of unevenness of all the DA conversion elements contributing to the transitional change constitutes the differential nonlinear error.

On the other hand, in the DA converter 100 illustrated in FIG. 16, five low-order bits change from "11111" to "00000" in the same way as described above, but the DA conversion elements of three high-order bits change differently. Change of three high-order bits from "011" to "100" in binary bits can be expressed as change from "0000111" to "0001111" in a control code of the DA converter 100. Accordingly, the capacitor C3 only changes from VREFN to VREFP.

That is, paying attention to only the DA conversion elements of high-order bits, the capacitor C4 with a weight 4, the capacitor C5 with a weight 2, and the capacitor C6 with a weight 1 (a total of six capacitors) change in the DA converter 200, but only the capacitor C3 with a weight 1 (a total of one capacitor) changes in the DA converter 100. Since an amount of unevenness of the DA conversion elements is prospected to increase as the number of capacitors increases, the differential nonlinear error is remarkably improved in the DA converter 100 in which the number of capacitors changing is smaller.

However, an integral nonlinear error which is an accumulation of errors in element unevenness is constant between the two DA converters when the element unevenness is the same. This can be simply construed to be an amount which depends on the number of capacitors. In the DA converter 200 in which three high-order bits are expressed by "100," the integral nonlinear error is judged based on an amount of element unevenness of the capacitor C4 (a total of four capacitors). In the DA converter 100, the integral nonlinear error is judged based on an amount of element unevenness of C0 to C3 (a total of four capacitors). The amount of unevenness of the elements changes depending on a manufacturing tolerance, but since the amount of unevenness does not change with the same total number of elements, unevenness of the integral nonlinear error is constant.

For example, Patent Document 1 (U.S. Pat. No. 8,164,495) discloses a technique of measuring an integral nonlinear error, generating a code value for correcting deterioration thereof, and storing the value in a nonvolatile memory as a technique of improving the integral nonlinear error.

However, in order to perform calibration by measuring an element mismatch as in the related art, a control circuit that performs a measuring sequence, a circuit that calculates a correction code, a memory that stores the correction code, and the like are required and thus a circuit area and costs increase.

SUMMARY

The disclosure provides a successive approximation AD converter that can improve an integral nonlinear error without performing calibration for an element mismatch of a DA converter.

According to an embodiment of the disclosure, there is provided a successive approximation AD converter including: a comparator that generates a judge signal indicating a result of comparison between an input analog signal and a reference signal; a successive approximation register that successively generates a register signal including a first bit signal and a second bit signal based on the judge signal and generates an AD conversion value of the input analog signal; a thermometer decoder that switches a plurality of different thermometer code conversion rules and converts the first bit signal to thermometer codes corresponding to the plurality of different thermometer code conversion rules in one cycle of AD conversion; a first DA converter that converts the thermometer codes to a first analog signal; a second DA converter the converts the second bit signal to a second analog signal; a reference signal generator that generates the reference signal based on the first analog signal and the second analog signal; and an average value calculator configured to calculate an average value of the AD conversion values according to the plurality of different thermometer codes. At least two of the plurality of different thermometer codes have values in which a high-order bit group and a low-order bit group obtained by dividing total bits of the thermometer codes equally are exchanged.

BRIEF DESCRIPTION OF THE DRAWINGS

FIG. 2 is a diagram illustrating thermometer code conversion rules in the successive approximation AD converter according to the first embodiment;

FIG. 4 is a diagram illustrating a differential nonlinear error and an integral nonlinear error in the successive approximation AD converter according to the first embodiment;

FIG. 5 is a diagram illustrating an advantage of the successive approximation AD converter according to the first embodiment;

FIG. 11 is a diagram illustrating an operation sequence of the successive approximation AD converter according to the second embodiment;

FIG. 13 is a diagram illustrating thermometer code conversion rules in the successive approximation AD converter according to the third embodiment;

FIG. 14 is a diagram illustrating an example of an integral nonlinear error in the successive approximation AD converter according to the third embodiment;

FIG. 15 is a diagram illustrating an advantage of the successive approximation AD converter according to the third embodiment;

FIG. 20 is a diagram illustrating an advantage of a successive approximation AD converter 1 when the number of thermometer bits is even;

FIG. 21 is a diagram illustrating an example of a thermometer code conversion rule according to an embodiment.

DESCRIPTION OF THE EMBODIMENTS

Hereinafter, embodiments of the disclosure will be described in detail with reference to the accompanying drawings. In the following description and the drawings, "AD conversion" and "DA conversion" may also be referred to as "ADC" and "DAC," respectively.

First Embodiment

Figure 1:
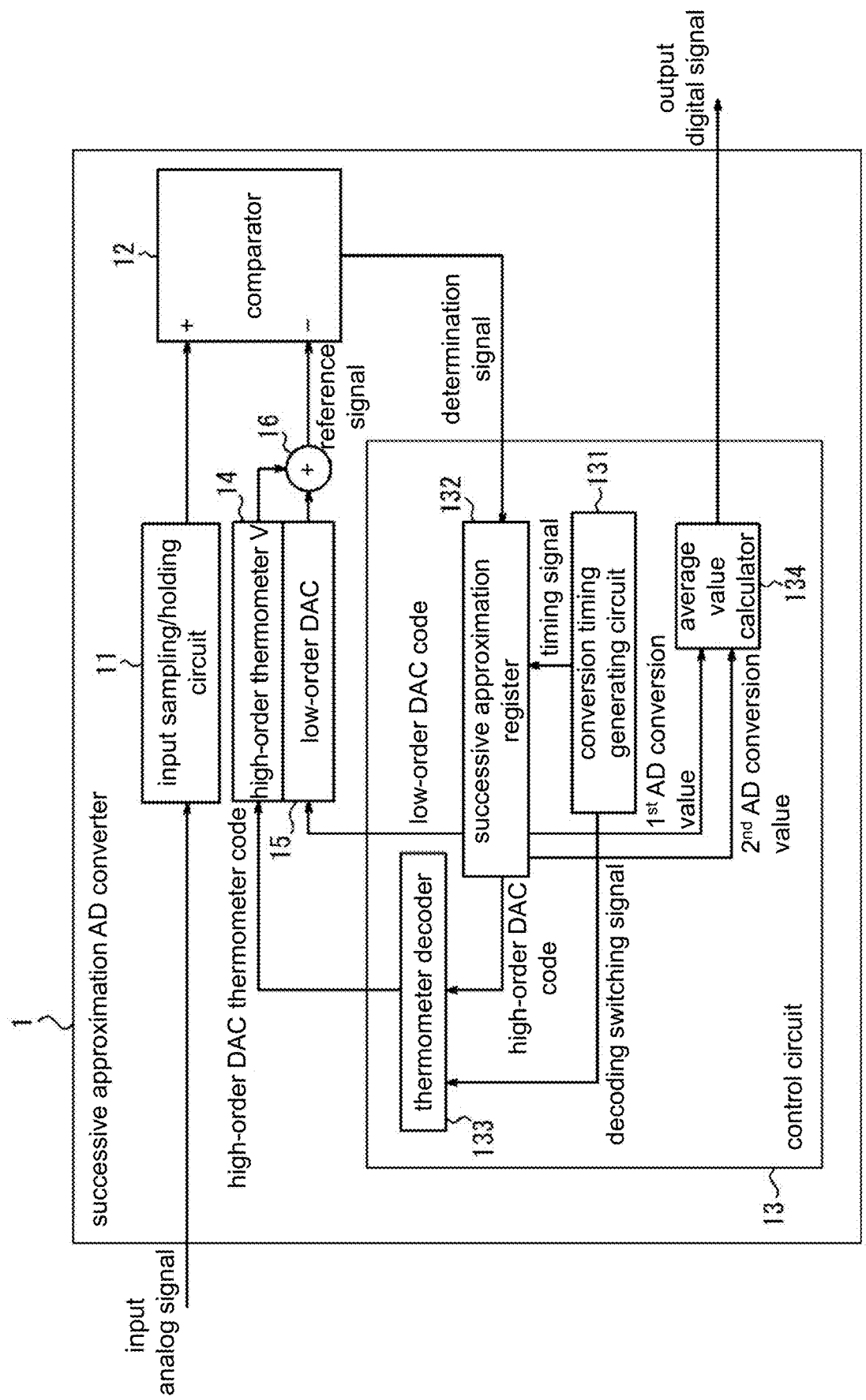
FIG. 1 is a block diagram illustrating an example of a configuration of a successive approximation AD converter according to a first embodiment.

A successive approximation AD converter according to a first embodiment will be described below. FIG. 1 is a block diagram illustrating an example of a configuration of the successive approximation AD converter according to the first embodiment. The successive approximation AD converter 1 illustrated in FIG. 1 includes an input sampling/holding circuit 11, a comparator 12, a control circuit 13, a high-order thermometer DAC (first DA converter) 14, a low-order DAC (second DA converter) 15, and a reference signal generator 16.

The input sampling/holding circuit 11 samples and holds an input analog signal.

The comparator 12 compares the input analog signal held in the input sampling/holding circuit 11 with a reference signal, and generates a judge signal indicating a result of comparison to the control circuit 13. The reference signal is a signal which is generated by the reference signal generator 16.

The control circuit 13 includes a conversion timing generating circuit 131, a successive approximation register (SAR) 132, a thermometer decoder 133, and an average value calculator 134.

The conversion timing generating circuit 131 generates a timing signal (a conversion trigger signal) indicating a timing at which the input analog signal is converted to a digital signal to the successive approximation register 132. The conversion timing generating circuit 131 generates a decoding switching signal indicating a timing at which a decoding method is switched to the thermometer decoder 133. Details of the decoding method will be described later.

The successive approximation register 132 successively generates a register signal including a high-order DAC code (a first bit signal) which is high-order bits of a register value and a low-order DAC code (a second bit signal) which is low-order bits of the register value based on the judge signal received from the comparator 12. That is, when a timing signal is received from the conversion timing generating circuit 131, the successive approximation register 132 successively updates the register signal from MSB whenever the judge signal is received from the comparator 12. The successive approximation register 132 generates the high-order DAC code to the thermometer decoder 133 and generates the low-order DAC code to the low-order DAC 15. When AD conversion is completed based on the judge signal, the successive approximation register 132 generates an AD conversion value of the input analog signal to the average value calculator 134. When a next timing signal is received from the conversion timing generating circuit 131, the successive approximation register 132 repeatedly performs this operation.

The thermometer decoder 133 converts a high-order DAC code which is a binary code received from the successive approximation register 132 to a high-order DAC thermometer code in accordance with a thermometer code conversion rule for converting a binary code to a thermometer code, and generates the generated high-order DAC thermometer code to the high-order thermometer DAC 14. The thermometer decoder 133 switches the thermometer code conversion rule (that is, switches the decoding method) in one cycle of AD conversion (that is, in one cycle of a timing signal). Then, the thermometer decoder 133 converts the high-order DAC code to high-order DAC thermometer codes corresponding to a plurality of different thermometer code conversion rules.

Since the thermometer decoder 133 converts a high-order DAC code to n high-order DAC thermometer codes using n thermometer code conversion rules in one cycle of AD conversion, the successive approximation register 132 generates n AD conversion values in one cycle of AD conversion and generates the generated AD conversion values to the average value calculator 134. The value of n is not limited, and n=2 is set in this embodiment.

The average value calculator 134 calculates an average value of the AD conversion values (a first AD conversion value and a second AD conversion value) corresponding to the different high-order DAC thermometer codes in one cycle of AD conversion, for example, using an addition circuit and a bit shift circuit, and generates the calculated average value as an output digital signal indicating a final result of AD conversion to the outside.

The high-order thermometer DAC 14 corresponds to high-order bits of a DA converter which is constituted by the high-order thermometer DAC 14 and the low-order DAC 15, converts a high-order DAC thermometer code received from the thermometer decoder 133 to a first analog signal, and generates the first analog signal to the reference signal generator 16.

The low-order DAC 15 corresponds to low-order bits of the DA converter which is constituted by the high-order thermometer DAC 14 and the low-order DAC 15, converts a low-order DAC code received from the successive approximation register 132 to a second analog signal, and generates the second analog signal to the reference signal generator 16.

The reference signal generator 16 generates a reference signal by adding the first analog signal converted by the high-order thermometer DAC 14 and the second analog signal converted by the low-order DAC 15, and generates the generated reference signal to the comparator 12.

Figure 16:
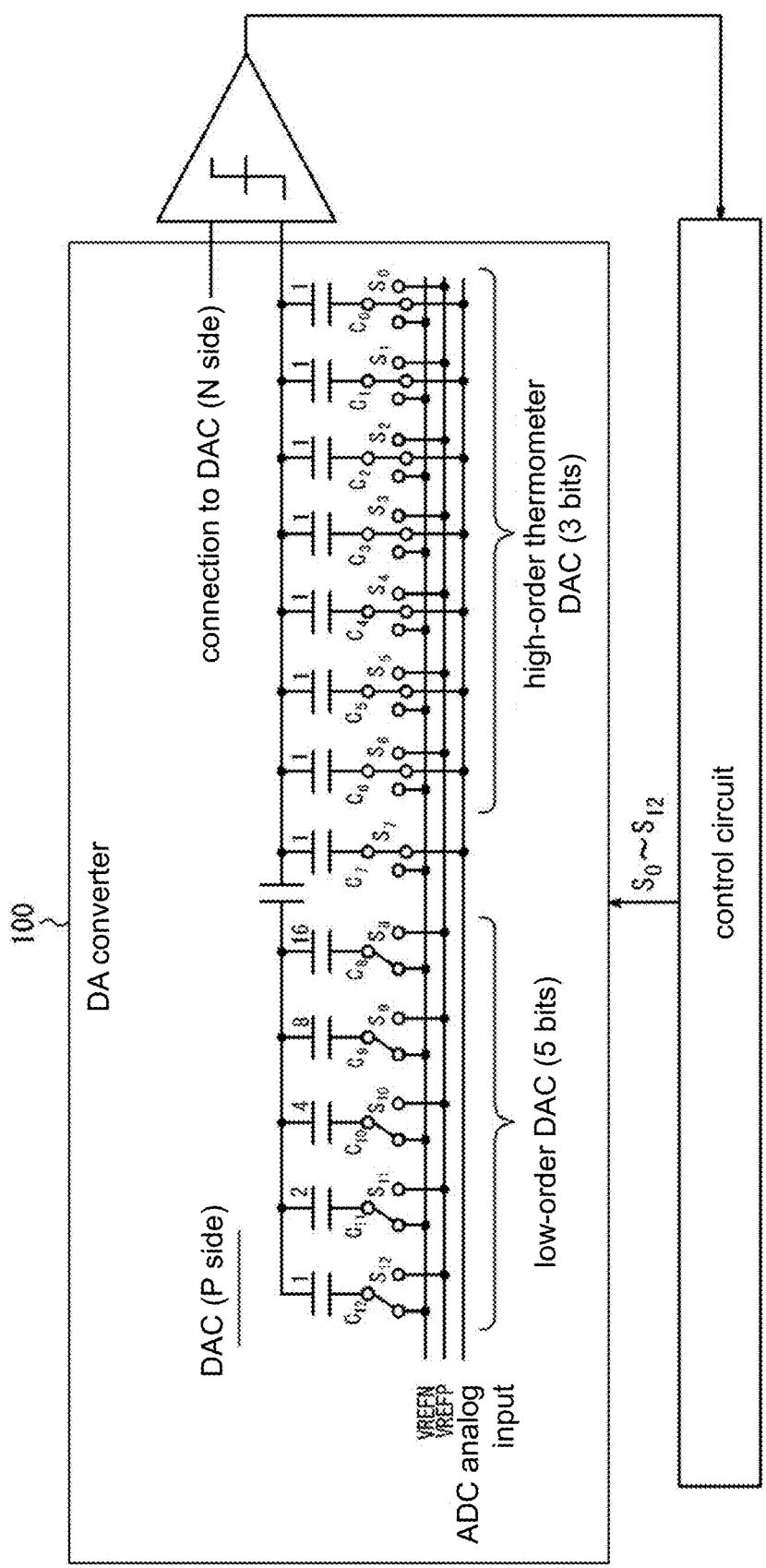
FIG. 16 is a diagram illustrating an example of a DA converter in which three high-order bits are configured by thermometer DA conversion elements and five low-order bits are configured by binary DA conversion elements.
Figure 17:
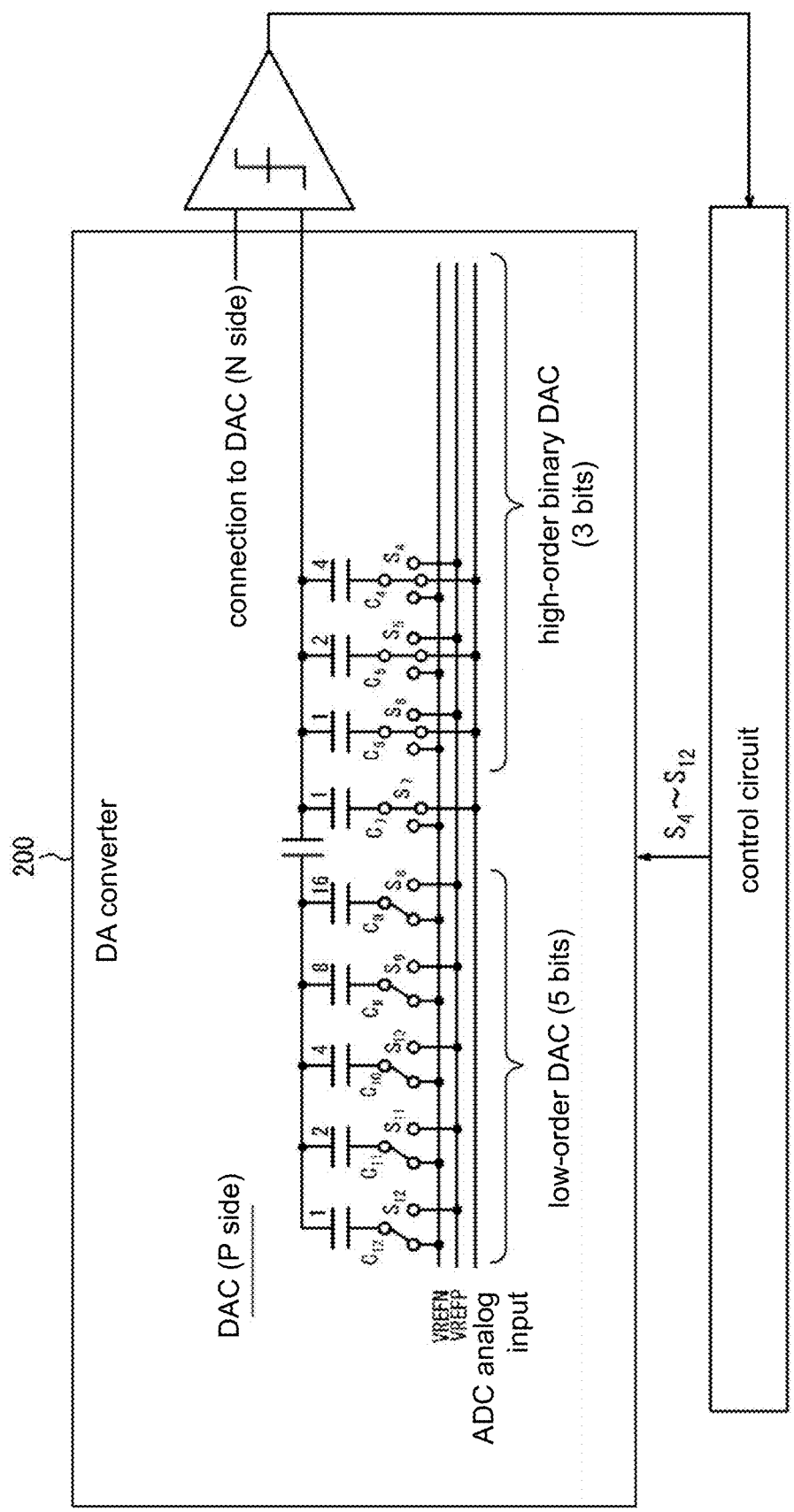
FIG. 17 is a diagram illustrating an example of a DA converter in which all eight bits are configured by binary DA conversion elements.

In the high-order thermometer DAC 14, capacitors are turned on to correspond to a binary code one by one. For example, when the high-order thermometer DAC 14 is a high-order thermometer DAC of three bits illustrated in FIG. 16, all of seven capacitors are connected to L (a negative reference voltage VREFN) when the binary code is "000."

A plurality of thermometer code conversion rules which is used for decoding in the thermometer decoder 133 will be described below. A plurality of high-order DAC thermometer codes which is generated using a plurality of thermometer code conversion rules has the same center bit value, and two high-order DAC thermometer codes thereof have values in which a high-order bit group including higher orders than the center bit and a low-order bit group including lower orders than the center bit are exchanged with respect to the center bit. For example, when a first high-order DAC thermometer code which is converted in accordance with a first thermometer code conversion rule is "c6 c5 c4 c3 c2 c1 c0" (values of which are "0" or "1"), a second high-order DAC thermometer code which is converted in accordance with a second thermometer code conversion rule has the same center bit value as the center bit c3 of the first high-order DAC thermometer code. The values of a high-order bit group of the second high-order DAC thermometer code are equal to the values of a low-order bit group of the first high-order DAC thermometer code, and the values of a low-order bit group of the second high-order DAC thermometer code are equal to the values of a high-order bit group of the first high-order DAC thermometer code. Accordingly, the second high-order DAC thermometer code is "c0 c1 c2 c3 c4 c5 c6," "c2 c1 c0 c3 c6 c5 c4," or the like.

FIG. 2 is a diagram illustrating an example of a thermometer code conversion rule. In a first decoding method using a first thermometer code conversion rule illustrated in (a) of FIG. 2, the capacitor C0 is connected to H (a positive reference voltage VREFP) when the binary code is "001," the capacitors C1 and C2 are sequentially connected to H with an increase of the binary code, and all of seven capacitors are connected to H when the capacitor C6 is connected to H. That is, when the first thermometer code conversion rule illustrated in (a) of FIG. 2 is used, the thermometer decoder 133 converts an input high-order DAC code "001" to a high-order DAC thermometer code "0000001" when the input high-order DAC code is "001."

In a second decoding method using a second thermometer code conversion rule illustrated in (b) of FIG. 2, the capacitors are sequentially turned on in the order opposite to that illustrated in (a) FIG. 2. That is, the capacitor C6 is connected to H (the positive reference voltage VREFP) when the binary code is "001," the capacitors C5 and C4 are sequentially connected to H with an increase of the binary code, and all of seven capacitors are turned on when the capacitor C0 is connected to H. That is, when the second thermometer code conversion rule illustrated in (b) of FIG. 2 is used, the thermometer decoder 133 converts the input high-order DAC code "001" to a high-order DAC thermometer code "1000000" when the input high-order DAC code is "001."

These two decoding methods correspond to changing the capacitors C0, C1, and C2 to C6, C5, and C4, respectively, with change of the binary value, and the capacitor C3 corresponds to the same change of the binary value in any decoding method. That is, the thermometer decoder 133 converts a high-order DAC code to the first high-order DAC thermometer code and the second high-order DAC thermometer code with a relationship in which arrangements of "0" and "1" are point-symmetric with respect to the center bit (corresponding to C3) of the thermometer code in one cycle of AD conversion by converting the high-order DAC code using the first thermometer code conversion rule and the second thermometer code conversion rule illustrated in FIG. 2. That is, at least two of the different thermometer codes have values in which a high-order bit group and a low-order bit group obtained by dividing the total bits of the thermometer code equally are exchanged.

(Operation Sequence)

Figure 3:
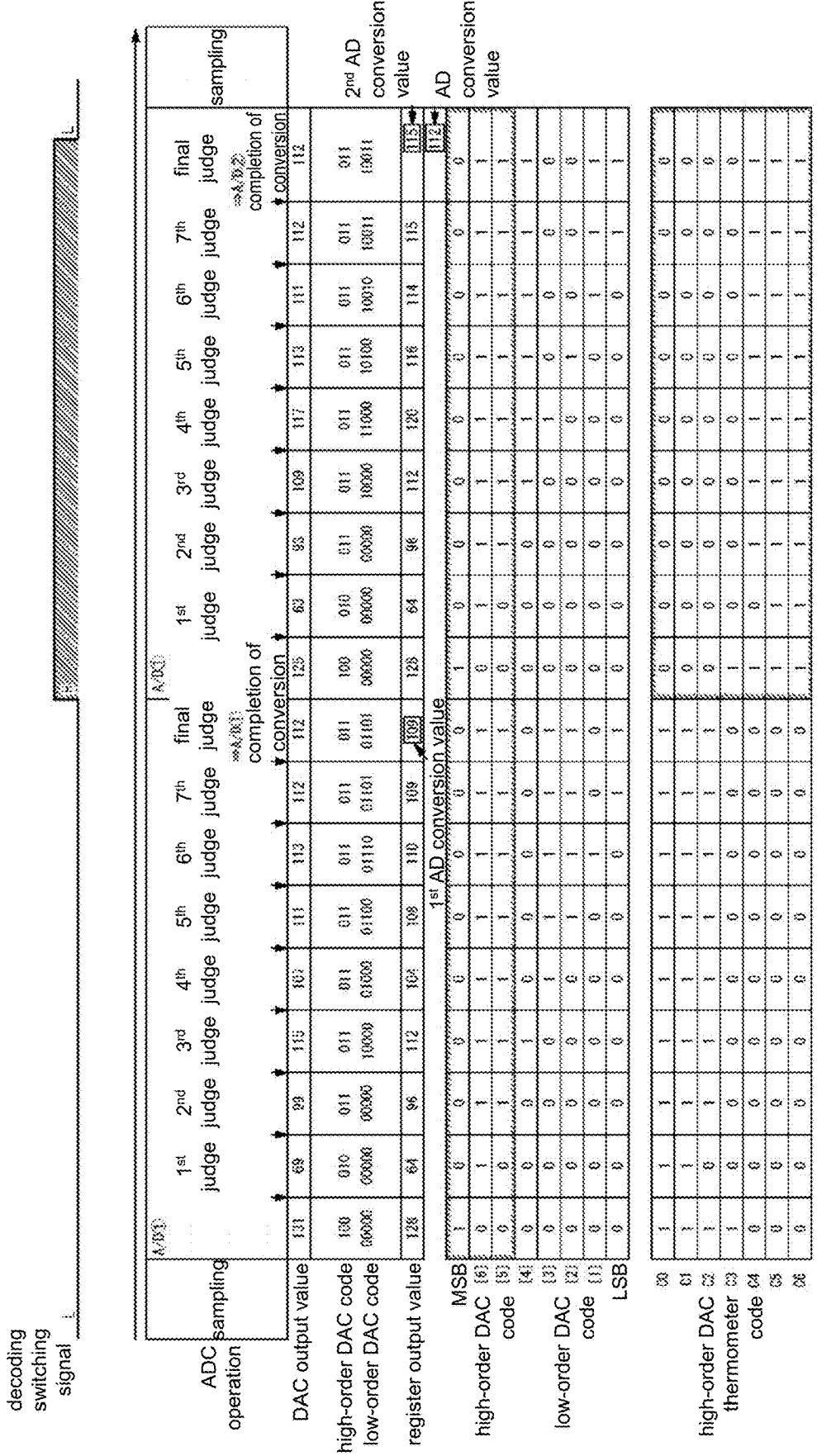
FIG. 3 is a diagram illustrating an operation sequence of the successive approximation AD converter according to the first embodiment.

An operation sequence of the successive approximation AD converter 1 will be described below with reference to FIGS. 3 and 4. FIG. 4 is a diagram illustrating examples of a differential nonlinear error (DNL) and an integral nonlinear error (INL) when the thermometer decoder 133 performs decoding in accordance with the thermometer code conversion rule illustrated in FIG. 2. FIG. 3 is a diagram illustrating an operation sequence of the successive approximation AD converter 1 and illustrates a conversion sequence when an input analog signal is received and specific bit values at that time in a case in which there is DA conversion element unevenness illustrated in FIG. 4. In this embodiment, it is assumed that the successive approximation AD converter 1 converts an input analog signal to an output digital signal of eight bits, the thermometer decoder 133 decodes three high-order bits, and an integral nonlinear error is generated by only three high-order bits with a great weight.

First, the input sampling/holding circuit 11 samples an input analog signal. The sampled input analog value is held for one period of a decoding switching signal. In the example illustrated in FIG. 3, the input analog value is "112."

The successive approximation register 132 converts the sampled input analog value by successive approximation using the first decoding method in the period in which the decoding switching signal is L, and acquires a first AD conversion value.

Specifically, the successive approximation register 132 first sets a register output value to "128." The thermometer decoder 133 decodes three high-order bits "100" in accordance with the first thermometer code conversion rule, and connects the capacitors C0 to C3 to H. At this time, since the integral nonlinear error is +3 with reference to FIG. 4, a DAC output value which is generated from the high-order thermometer DAC 14 and the low-order DAC 15 is "131." The comparator 12 compares the DAC output value which is a reference signal with the input analog value "112" and generates a judge signal indicating that the reference signal is greater to the successive approximation register 132 in first judge. The successive approximation register 132 judges the most significant bit (MSB) to be "0" based on the judge signal.

Then, the successive approximation register 132 sets the register output value to "64." The thermometer decoder 133 decodes three high-order bits "010" in accordance with the first thermometer code conversion rule, and connects the capacitors C0 and C1 to H. At this time, since the integral nonlinear error is +5 with reference to FIG. 4, the DAC output value which is generated from the high-order thermometer DAC 14 and the low-order DAC 15 is "69." The comparator 12 compares the DAC output value which is a reference signal with the input analog value "112" and generates a judge signal indicating that the reference signal is less to the successive approximation register 132 in second judge. The successive approximation register 132 judges the sixth bit to be "1" based on the judge signal.

Judge is continuously performed in the same way, and the successive approximation register 132 sets the register output value to "109" in final judge. The thermometer decoder 133 decodes three high-order bits "011" in accordance with the first thermometer code conversion rule, and connects the capacitors C0 to C2 to H. At this time, since the integral nonlinear error is +3 with reference to FIG. 4, the DAC output value which is generated from the high-order thermometer DAC 14 and the low-order DAC 15 is "112," which matches the input analog value. Accordingly, the successive approximation register 132 judges the least significant bit (LSB) to be "1" and generates "109" as the first AD conversion value to the average value calculator 134.

Then, the successive approximation register 132 converts the sampled input analog signal by successive approximation using the second decoding method in the period in which the decoding switching signal is H, and acquires a second AD conversion value.

Specifically, the successive approximation register 132 first sets the register output value to "128." The thermometer decoder 133 decodes three high-order bits "100" in accordance with the second thermometer code conversion rule, and connects the capacitors C3 to C6 to H. At this time, since the integral nonlinear error is −3 with reference to FIG. 4, the DAC output value which is generated from the high-order thermometer DAC 14 and the low-order DAC 15 is "125." The comparator 12 compares the DAC output value which is a reference signal with the input analog value "112" and generates a judge signal indicating that the reference signal is greater to the successive approximation register 132 in first judge. The successive approximation register 132 judges the most significant bit (MSB) to be "0" based on the judge signal.

Then, the successive approximation register 132 sets the register output value to "64." The thermometer decoder 133 decodes three high-order bits "010" in accordance with the second thermometer code conversion rule, and connects the capacitors C5 and C6 to H. At this time, since the integral nonlinear error is −1 with reference to FIG. 4, the DAC output value which is generated from the high-order thermometer DAC 14 and the low-order DAC 15 is "63." The comparator 12 compares the DAC output value which is a reference signal with the input analog value "112" and generates a judge signal indicating that the reference signal is less to the successive approximation register 132 in second judge. The successive approximation register 132 judges the sixth bit to be "1" based on the judge signal.

Judge is continuously performed in the same way, and the successive approximation register 132 sets the register output value to "115" in final judge. The thermometer decoder 133 decodes three high-order bits "011" in accordance with the second thermometer code conversion rule, and connects the capacitors C4 to C6 to H. At this time, since the integral nonlinear error is −3 with reference to FIG. 4, the DAC output value which is generated from the high-order thermometer DAC 14 and the low-order DAC 15 is "112," which matches the input analog value. Accordingly, the successive approximation register 132 judges the least significant bit (LSB) to be "1" and generates "115" as the second AD conversion value to the average value calculator 134.

Then, an average value of the first AD conversion value and the second AD conversion value is calculated as a final AD conversion value by the average value calculator 134 and the final AD conversion value is generated to the outside as an output digital signal. In this example, the average value calculator 134 calculates the average value "112" of "109" and "115." Through this operation, different AD conversion curves including integral nonlinear errors corresponding to a difference between the decoding methods can be averaged.

FIG. 5 is a diagram illustrating an advantage of the successive approximation AD converter 1 and illustrates that the integral nonlinear error decreases through the aforementioned process when there is the DA conversion element unevenness illustrated in FIG. 4. The integral nonlinear error when the capacitors C0 to C6 have element unevenness changes depending on the decoding methods. In the first decoding method and the second decoding method described above with reference to FIG. 4, a waveform indicating the integral nonlinear error (an INL waveform) has point symmetry with respect to the center.

Accordingly, by averaging the INL waveform in the first decoding method and the INL waveform in the second decoding method, a component of an even function in a waveform distortion disappears and thus the INL waveform is improved. Since unevenness of the INL waveform is random, a component of an even function and a component of an odd function included in the waveform are expected to be stochastically equivalent to each other. Accordingly, it is possible to improve an average and a variance of a probability distribution of the INL waveform distortion due to element unevenness. With the element unevenness in the example illustrated in FIG. 4, it can be seen that the integral nonlinear error has decreased to almost a half thereof.

Figure 6:
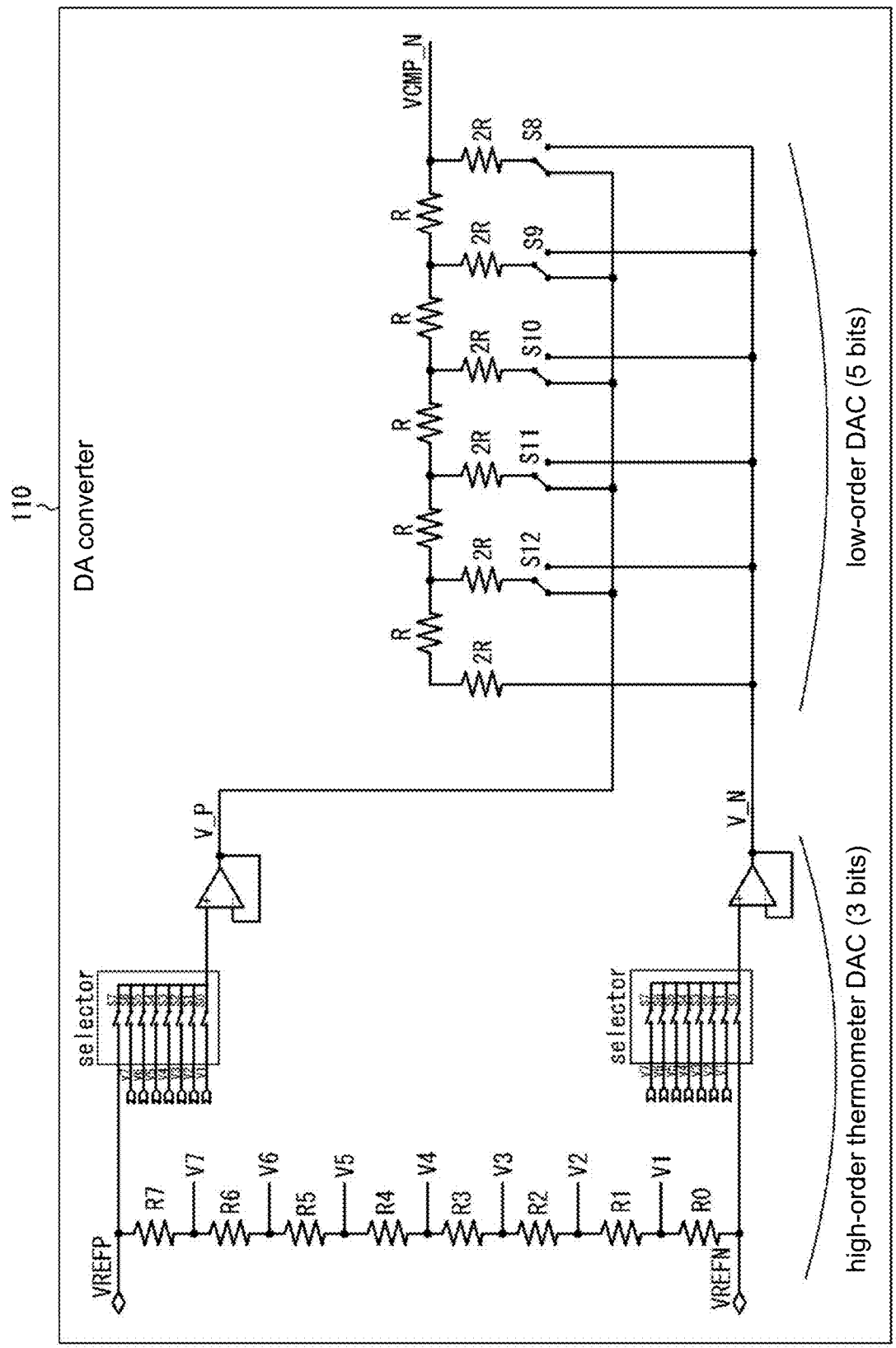
FIG. 6 is a diagram illustrating a DA converter using resistors as DA conversion elements.

The DA conversion elements are not limited to capacitors and resistors may be employed. FIG. 6 is a diagram illustrating an example of a DA converter using resistors as the DA conversion elements. This DA converter 110 corresponds to the DA converter 100 illustrated in FIG. 16, where three high-order bits are constituted as a thermometer DAC and five low-order bits are constituted as a binary DAC.

As described above, the successive approximation AD converter 1 according to the first embodiment includes the comparator 12 that generates a judge signal indicating a result of comparison between an input analog signal and a reference signal, the successive approximation register 132 that generates a register signal including a high-order DAC code (a first bit signal) and a low-order DAC code (a second bit signal) and generates an AD conversion value of the input analog signal, the thermometer decoder 133 that switches the decoding method and converts the high-order DAC code to different thermometer codes (high-order DAC thermometer codes) in one cycle of AD conversion, the first DAC converter (a high-order thermometer DAC) 14 that converts the high-order DAC thermometer codes to a first analog signal, the second DA converter (a low-order DAC) 15 that converts the low-order DAC code to a second analog signal, the reference signal generator 16 that generates the reference signal based on the first analog signal and the second analog signal, and the average value calculator 134 that calculates an average value of the register signals based on a plurality of high-order DAC thermometer codes which are generated from the successive approximation register 132. Accordingly, with the successive approximation AD converter 1, it is possible to improve the integral nonlinear error.

As described above, a case in which the number of high-order thermometer DACs 14 is odd will be described below. In the following description, it is assumed that the number of bits of the high-order thermometer DACs 14 is even. When the number of high-order thermometer DACs 14 is even, there is no center bit and the same advantage as when there is a center bit is obtained by considering a midpoint obtained by dividing the thermometer code equally as a center bit. For example, when six capacitors are provided and a binary code is "000," all the six capacitors are connected to L (a negative reference voltage VREFN). When the binary code is "110," all the six capacitors are connected to H (a positive reference voltage VREFP).

A plurality of thermometer code conversion rules which is used for decoding in the thermometer decoder 133 will be described below. Out of a plurality of high-order DAC thermometer codes which is generated using a plurality of thermometer code conversion rules, two high-order DAC thermometer codes have values in which values of a high-order bit group and a low-order bit group are exchanged with respect to a midpoint between the high-order bit group and the low-order bit group. For example, when a first high-order DAC thermometer code which is converted by the first thermometer code conversion rule is "c5 c4 c3 c2 c1 c0" (values of which are "0" or "1"), the midpoint is a boundary between the high-order group "c5 c4 c3" and the low-order group "c2 c1 c0." In a second high-order DAC thermometer code which is converted by the second thermometer code conversion rule, values of the high-order bit group of the second high-order DAC thermometer code are values of the low-order bit group of the first high-order DAC thermometer code, and values of the low-order bit group of the second high-order DAC thermometer code are values of the high-order bit group of the first high-order DAC thermometer code. Accordingly, the second high-order DAC thermometer code is "c0 c1 c2 c3 c4 c5" or "c2 c1 c0 c5 c4 c3."

Figure 18:
FIG. 18 is a diagram illustrating an example of a thermometer code conversion rule.

FIG. 18 is a diagram illustrating an example of thermometer code conversion rules. In a first decoding method using a first thermometer code conversion rule illustrated in (a) of FIG. 18, the capacitor C0 is connected to H (a positive reference voltage VREFP) when the binary code is "001," the capacitors C1 and C2 are sequentially connected to H with an increase of the binary code, and all the six capacitors are connected to H when the capacitor C5 is connected to H. That is, when the first thermometer code conversion rule illustrated in (a) of FIG. 18 is used, the thermometer decoder 133 converts an input high-order DAC code "001" to a high-order DAC thermometer code "000001" when the input high-order DAC code is "001."

In a second decoding method using a second thermometer code conversion rule illustrated in (b) of FIG. 18, the capacitors are sequentially turned on in the order opposite to that illustrated in (a) of FIG. 18. That is, the capacitor C5 is connected to H (the positive reference voltage VREFP) when the binary code is "001," the capacitors C4 and C3 are sequentially connected to H with an increase of the binary code, and all the six capacitors are turned on when the capacitor C0 is connected to H. That is, when the second thermometer code conversion rule illustrated in (b) of FIG. 18 is used, the thermometer decoder 133 converts the input high-order DAC code "001" to a high-order DAC thermometer code "100000" when the input high-order DAC code is "001."

These two decoding methods correspond to changing the capacitors C0, C1, and C2 to C5, C4, and C3, respectively, with change of the binary value. That is, the thermometer decoder 133 converts a high-order DAC code to a first high-order DAC thermometer code and a second high-order DAC thermometer code with a relationship in which arrangements of "0" and "1" are point-symmetric with respect to the midpoint (corresponding to a boundary between C2 and C3) of the thermometer code in one cycle of AD conversion by converting the high-order DAC code using the first thermometer code conversion rule and the second thermometer code conversion rule illustrated in FIG. 18.

Figure 19:
FIG. 19 is a diagram illustrating an example in which in a first decoding method and a second decoding method have a relationship in which waveforms indicating integral nonlinear errors (INL waveforms) thereof are point-symmetric with respect to the center thereof.

FIG. 20 is a diagram illustrating an advantage of the successive approximation AD converter 1 when the number of thermometer bits is even, and illustrates that the integral nonlinear error decreases when there is the DA conversion element unevenness illustrated in FIG. 19 similarly to the case in which there is a center bit. The integral nonlinear error when the capacitors C0 to C5 have element unevenness changes depending on the decoding methods. In the first decoding method and the second decoding method described above with reference to FIG. 19, a waveform indicating the integral nonlinear error (an INL waveform) has point symmetry with respect to the center.

Accordingly, by averaging the INL waveform in the first decoding method and the INL waveform in the second decoding method, a component of an even function in a waveform distortion disappears and thus the INL waveform is improved.

Second Embodiment

A successive approximation AD converter according to a second embodiment will be described below. As described above, the INL waveform changes by switching the decoding method, but a difference thereof is a peak-peak value of the waveforms at most. That is, it means that there is only two times an amount of error of the maximum INL error in a successive approximation AD conversion result obtained by performing conversion using the first decoding method at most. In an AD converter of eight bits including the DA converter illustrated in FIG. 16, a conversion range thereof is ±128 codes.

Figure 7:
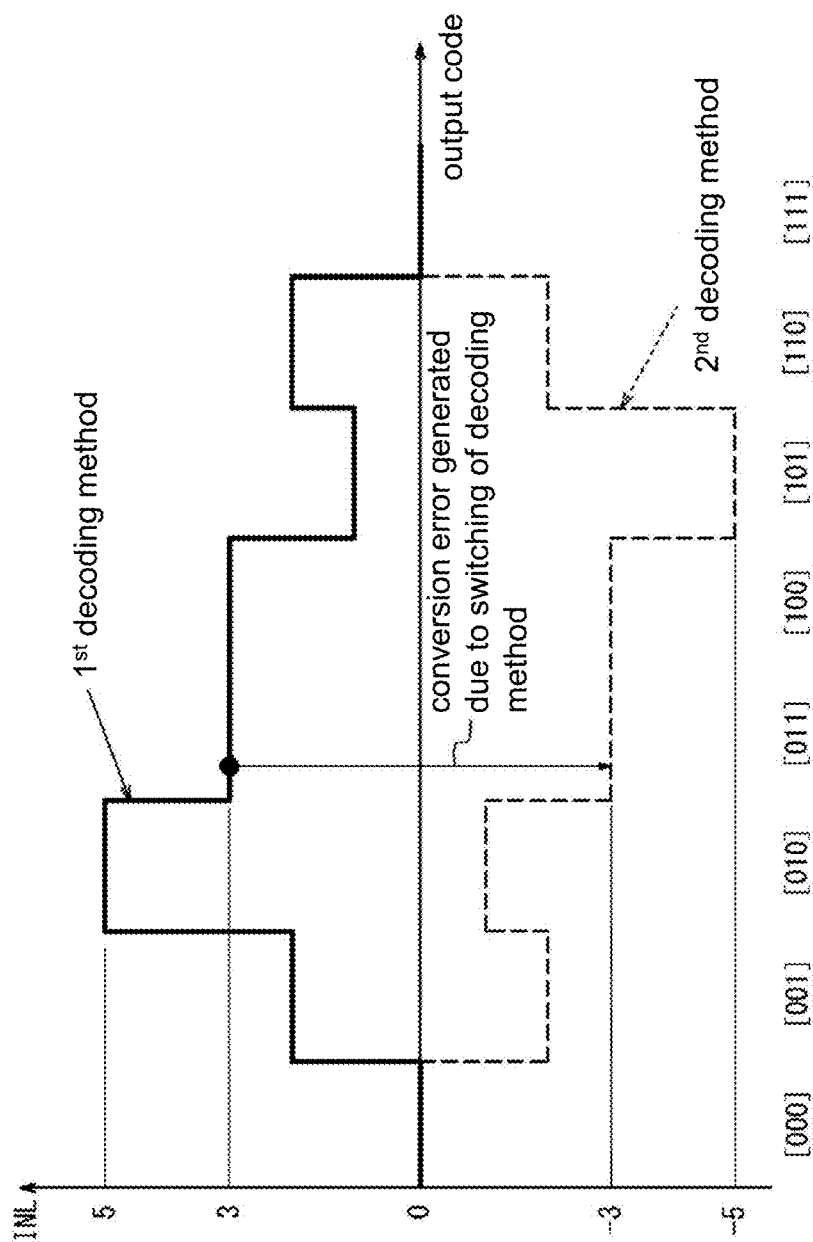
FIG. 7 is a diagram illustrating an example of a conversion error which is caused by causing a thermometer decoder to switch a thermometer code conversion rule in the successive approximation AD converter according to the first embodiment.

FIG. 7 is a diagram illustrating an example of a conversion error which is caused by causing the thermometer decoder 133 to switch the thermometer code conversion rule. Here, the same integral nonlinear error as illustrated in FIG. 4 is illustrated, and a conversion error of −6 codes is generated after the first thermometer code conversion rule has been switched to the second thermometer code conversion rule when the high-order DAC code is "011." That is, a result of addition of six codes to the first AD conversion value converted using the first decoding method becomes the second AD conversion value converted using the second decoding method. Accordingly, in FIG. 3, the first AD conversion value is "109" and the second AD conversion value "115." As a result, the AD conversion after the thermometer code conversion rule has been switched can employ the AD conversion result before the thermometer code conversion rule has been switched, and several low-order bits with a likelihood of changing can be corrected.

Accordingly, after the thermometer decoder 133 has switched the thermometer code conversion rule, the successive approximation register 132 fixes the high-order DAC codes to the high-order DAC codes immediately before the thermometer decoder 133 has switched the thermometer code conversion rule.

Figure 8:
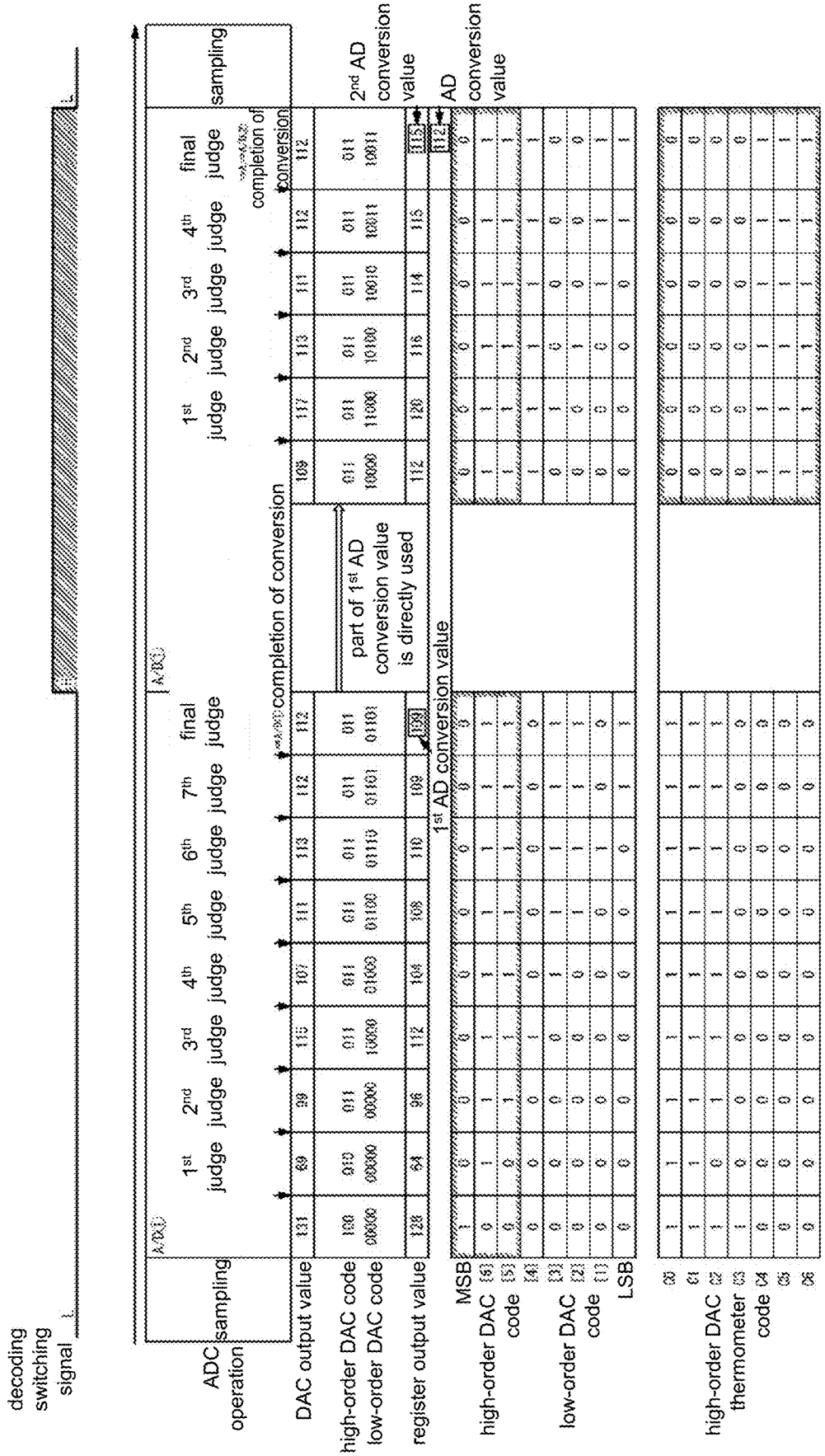
FIG. 8 is a diagram illustrating an example in which AD conversion based on a second thermometer code conversion rule is performed using a result of AD conversion based on a first thermometer code conversion rule in the operation sequence illustrated in FIG. 3.

FIG. 8 is a diagram illustrating an example in which successive approximation conversion based on the second decoding method in the period in which the decoding switching signal is H employs the result of AD conversion based on the first decoding method in the operation sequence illustrated in FIG. 3. In FIG. 8, a blank period appears after the decoding switching signal has become H, but this is provided for the purpose of convenience of comparison with FIG. 3 and is not actually present.

When the decoding switching signal becomes H, the successive approximation register 132 fixes the high-order DAC codes (three high-order bits in this embodiment) to "011" using the result of AD conversion based on the first decoding method. That is, in the AD conversion after the decoding method has been switched, it is possible to skip judge of three high-order bits and thus to shorten a judge time. Other processes are the same as in the first embodiment and thus description thereof will be omitted.

Figure 9:
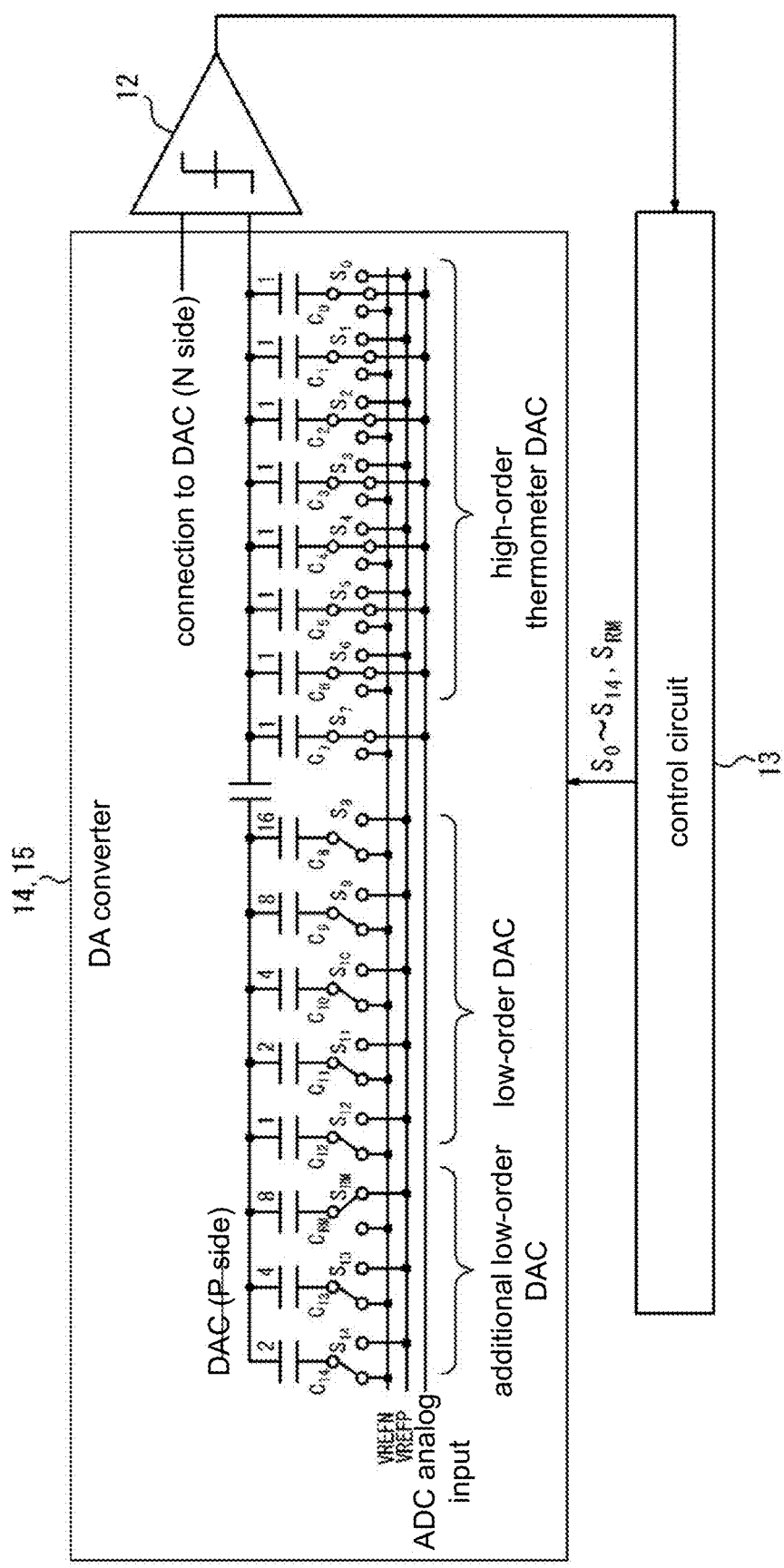
FIG. 9 is a diagram illustrating an example of a DC converter in which DA conversion elements of three bits are added to a low-order side.

By adding DA conversion elements to only the low-order side as illustrated in FIG. 9, it is possible to further decrease the conversion time. In this example, the DA converter additionally includes DA conversion elements of three bits on the low-order side. In the following description of the second embodiment, it is assumed that additional DA conversion elements are provided.

Figure 10:
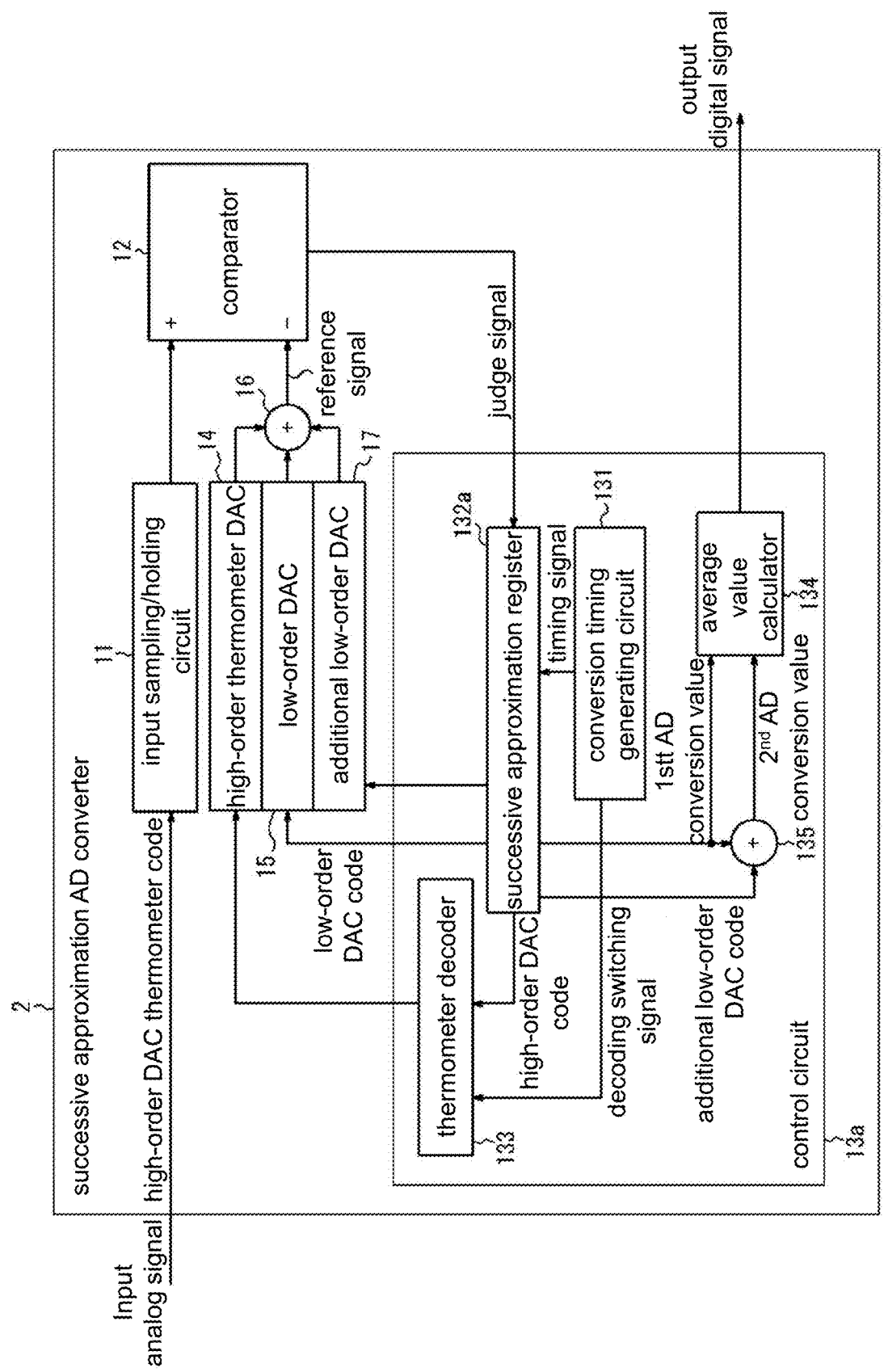
FIG. 10 is a block diagram illustrating an example of a configuration of a successive approximation AD converter according to a second embodiment.

FIG. 10 is a block diagram illustrating an example of a configuration of a successive approximation AD converter according to the second embodiment. The successive approximation AD converter 2 according to this embodiment is different from the successive approximation AD converter 1 according to the first embodiment, in that an additional low-order DAC (a third DA converter) 17 is additionally provided and a control circuit 13a is provided instead of the control circuit 13. Only differences from the successive approximation AD converter 1 according to the first embodiment will be described below.

The additional low-order DAC 17 is used to perform a successive approximation process on residuals which are generated by comparison of the first AD conversion value using the comparator 12 based on the second decoding method.

The control circuit 13a includes a conversion timing generating circuit 131, a successive approximation register 132a, a thermometer decoder 133, an average value calculator 134, and an adder 135.

The successive approximation register 132a successively generates a register signal including a high-order DAC code (a first bit signal) which is high-order bits of a register value, a low-order DAC code (a second bit signal) which is low-order bits of the register value, and an additional low-order DAC code (a third bit signal) which is additional low-order bits of the register value based on a judge signal received from the comparator 12.

Specifically, when the thermometer decoder 133 converts the high-order DAC code to a first high-order DAC thermometer code in accordance with the first thermometer code conversion rule, the successive approximation register 132a generates a high-order DAC code and a low-order DAC code based on the judge result similarly to the first embodiment. The additional low-order DAC code is not used and thus is fixed to "0."

When the thermometer decoder 133 converts the high-order DAC code to a second high-order DAC thermometer code in accordance with the second thermometer code conversion rule, the successive approximation register 132a uses the first AD conversion value obtained by performing a successive approximation process using the first thermometer code conversion rule as the values of the high-order DAC code and the low-order DAC code without any change.

Accordingly, after the thermometer decoder 133 has switched the thermometer code conversion rule, the successive approximation register 132a fixes the high-order DAC code and the low-order DAC code to the high-order DAC code and the low-order DAC code immediately before the thermometer decoder 133 switches the thermometer code conversion rule. The additional low-order DAC code has values based on the judge signal.

Figure 11:
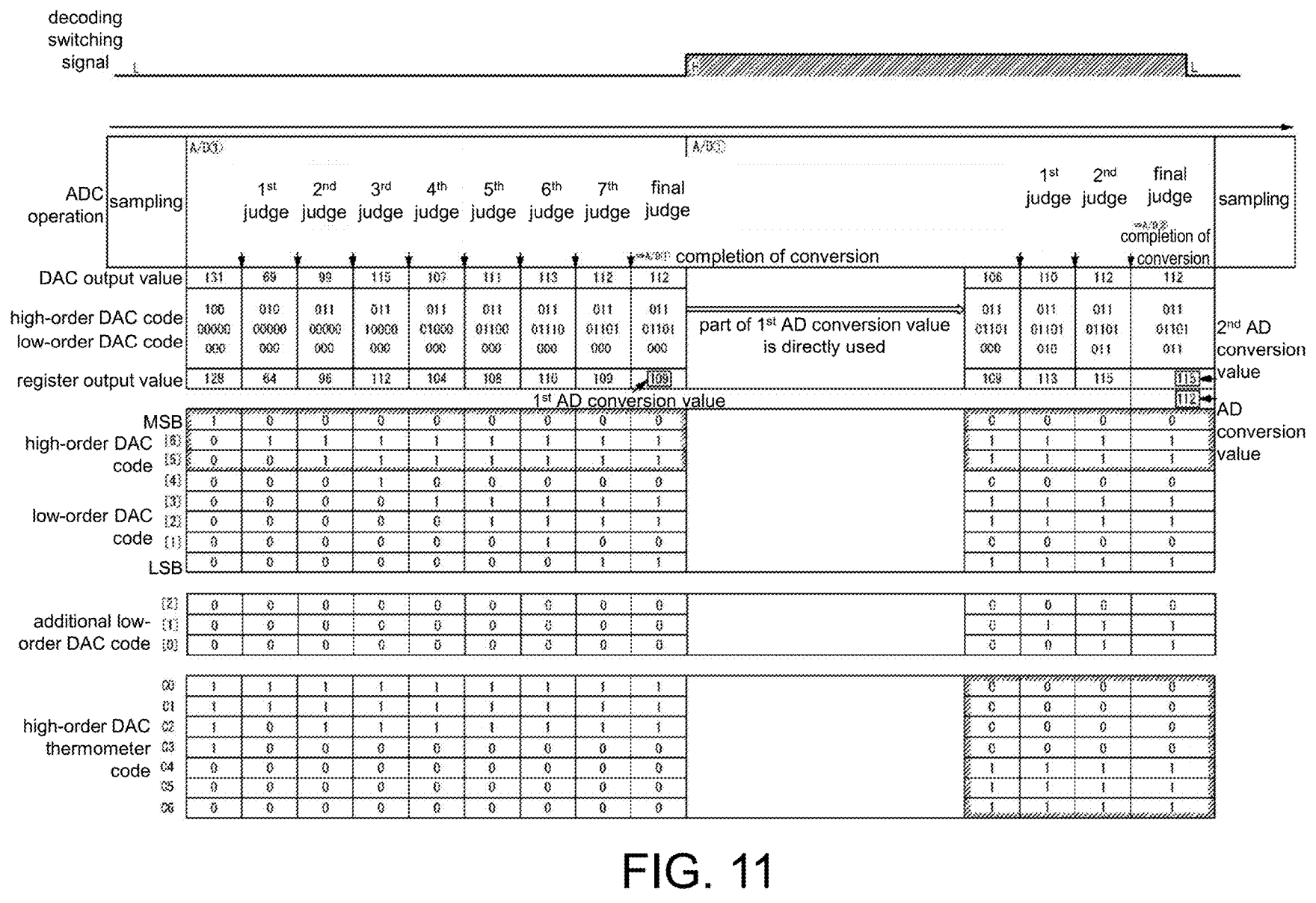

An operation sequence of the successive approximation AD converter 2 will be described below with reference to FIGS. 11 and 4. FIG. 11 is a diagram illustrating the operation sequence of the successive approximation AD converter according to the second embodiment. FIG. 11 illustrates an example in which successive approximation conversion based on the second decoding method in the period in which the decoding switching signal is H employs the result of AD conversion based on the first decoding method in the operation sequence illustrated in FIG. 3. In FIG. 11, a blank period appears after the decoding switching signal has become H, but this is provided for the purpose of convenience of comparison with FIG. 3 and is not actually present.

The polarity of the most significant bit of the additional low-order DAC code may be opposite to the polarity of the other bits. In this embodiment, when the decoding switching signal is H, the weight of the second bit of the additional low-order DAC code is set to −8, the weight of the first bit is set to 4, and the weight of the zeroth bit is set to 2. In this case, −8 to +6 can be added to the value which is represented by the high-order DAC code and the low-order DAC code using the additional low-order DAC code.

When the decoding switching signal becomes H, the successive approximation register 132a fixes the high-order DAC code (three high-order bits in this embodiment) to "011" and fixes the low-order DAC code (five high-order bits in this embodiment) to "01101" using the result of AD conversion based on the first decoding method. An initial value of the additional low-order DAC code is set to "000." That is, the successive approximation register 132a first sets the register output value to "109." The thermometer decoder 133 decodes the three high-order bits "011" in accordance with the second thermometer code conversion rule and connects the capacitors C4 to C6 to H. At this time, since the integral nonlinear error is −3 with reference to FIG. 4, a DAC output value which is generated from the high-order thermometer DAC 14, the low-order DAC 15, and the additional low-order DAC 17 is "106." The comparator 12 compares the input analog value "112" with the DAC output value which is a reference signal and generates a judge signal indicating that the reference signal is less to the successive approximation register 132a in first judge. The successive approximation register 132a judges the second bit of the additional low-order DAC code to be "0" based on the judge signal.

Then, the successive approximation register 132a sets the register output value to "113." The thermometer decoder 133 decodes the three high-order bits "011" in accordance with the second thermometer code conversion rule and connects the capacitors C4 to C6 to H. At this time, since the integral nonlinear error is −3 with reference to FIG. 4, the DAC output value which is generated from the high-order thermometer DAC 14, the low-order DAC 15, and the additional low-order DAC 17 is "110." The comparator 12 compares the input analog value "112" with the DAC output value which is a reference signal and generates a judge signal indicating that the reference signal is less to the successive approximation register 132a in second judge. The successive approximation register 132a judges the first bit of the additional low-order DAC code to be "1" based on the judge signal.

In final judge, the successive approximation register 132a sets the register output value to "115." The thermometer decoder 133 decodes the three high-order bits "011" in accordance with the second thermometer code conversion rule and connects the capacitors C4 to C6 to H. At this time, since the integral nonlinear error is −3 with reference to FIG. 4, the DAC output value which is generated from the high-order thermometer DAC 14, the low-order DAC 15, and the additional low-order DAC 17 is "112," which matches the input analog value. Accordingly, the successive approximation register 132a judges the zeroth bit of the additional low-order DAC code to be "1".

As described above, the successive approximation AD converter 2 according to the second embodiment uses the first AD conversion value in AD conversion after the decoding method has been switched. Accordingly, it is possible to greatly shorten the time required to judge the final AD conversion value.

Third Embodiment

A successive approximation AD converter according to a third embodiment will be described below. In the first embodiment and the second embodiment, the thermometer decoder 133 converts the high-order DAC code to different high-order DAC thermometer codes using two types of thermometer code conversion rules in one cycle of AD conversion. On the other hand, in this embodiment, the thermometer decoder 133 converts the high-order DAC code to different high-order DAC thermometer codes using four types of thermometer code conversion rules in one cycle of AD conversion.

Figure 12:
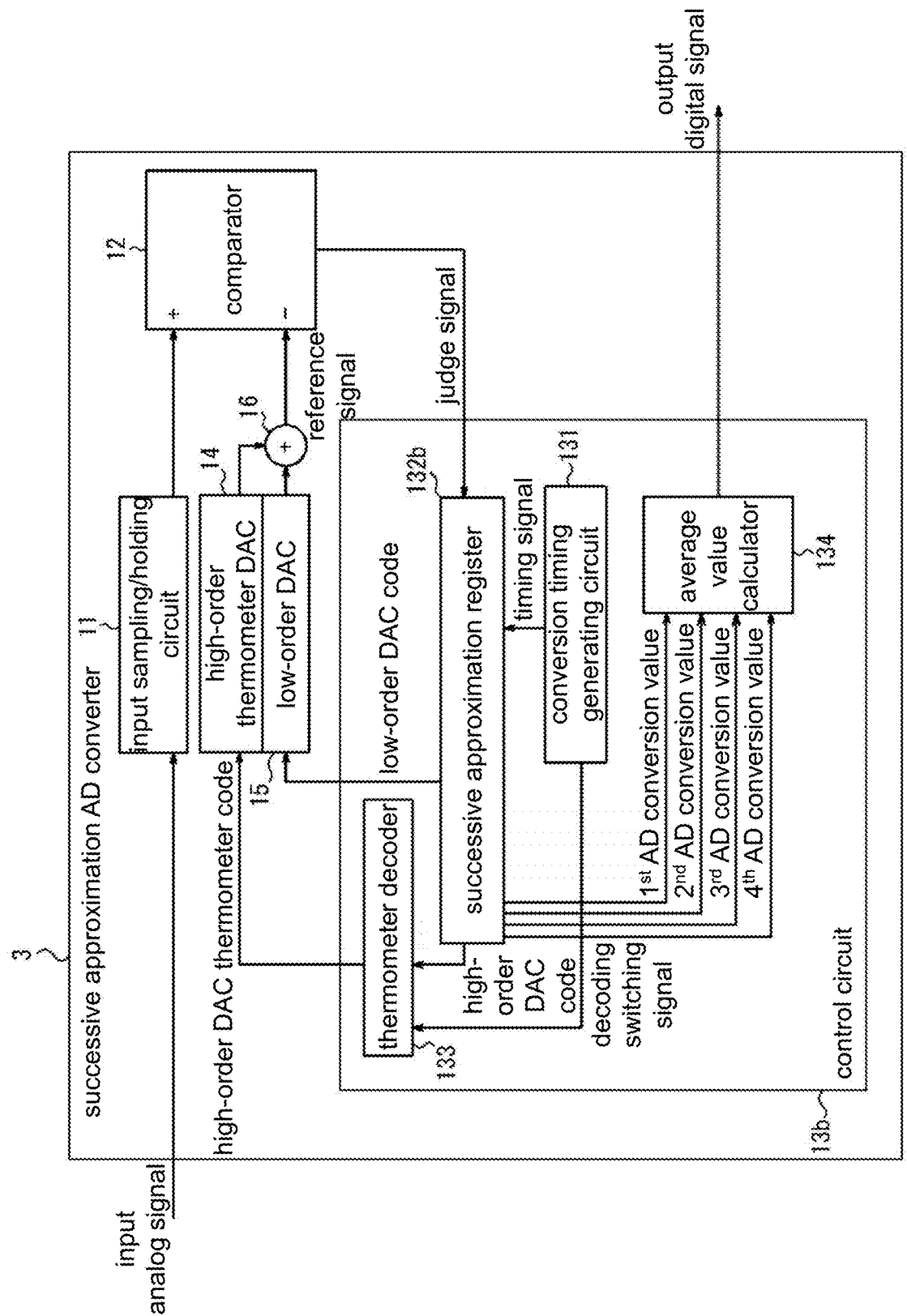
FIG. 12 is a block diagram illustrating an example of a configuration of a successive approximation AD converter according to a third embodiment.

FIG. 12 is a block diagram illustrating an example of a configuration of a successive approximation AD converter 3 according to the third embodiment. The successive approximation AD converter 3 according to this embodiment is different from the successive approximation AD converter 1 according to the first embodiment, in that a control circuit 13b is provided instead of the control circuit 13. Only differences from the successive approximation AD converter 1 according to the first embodiment will be described below.

The control circuit 13b includes a conversion timing generating circuit 131, a successive approximation register 132b, a thermometer decoder 133, an average value calculator 134, and an adder 135.

The conversion timing generating circuit 131 generates the decoding switching signal indicating a timing at which the decoding method is switched to the thermometer decoder 133. The number of timings in which the decoding method is switched in one cycle of AD conversion is one in the first embodiment, but since four types of thermometer code conversion rules are used in this embodiment, the number of timings at which the decoding method is switched in one cycle of AD conversion is three.

The successive approximation register 132b successively generates a register signal including a high-order DAC code (a first bit signal) which is high-order bits of a register value and a low-order DAC code (a second bit signal) which is low-order bits of the register value based on a judge signal received from the comparator 12. When AD conversion based on the judge signal has been completed, the successive approximation register 132b generates an AD conversion value of the input analog signal to the average value calculator 134. Since four types of thermometer code conversion rules are used in this embodiment, a first AD conversion value, a second AD conversion value, a third AD conversion value, and a fourth AD conversion value are generated in one cycle of AD conversion.

The average value calculator 134 calculates an average value of the AD conversion values (the first to fourth AD conversion values) corresponding to the different high-order DAC thermometer codes in one cycle of AD conversion, for example, using an addition circuit and a bit shift circuit, and externally generates the calculated average value as an output digital signal indicating a final result of AD conversion.

FIG. 13 is a diagram illustrating an example of thermometer code conversion rules in this embodiment. In this embodiment, the thermometer decoder 133 converts a high-order DAC code to different high-order DAC thermometer codes using the first thermometer code conversion rule illustrated in (a) of FIG. 2, the second thermometer code conversion rule illustrated in (b) of FIG. 2, a third thermometer code conversion rule illustrated in (a) of FIG. 13, and a fourth thermometer code conversion rule illustrated in (b) of FIG. 13.

The third thermometer code conversion rule illustrated in (a) of FIG. 13 is to invert the relationship between the capacitor C6 and the capacitor C4 and to invert the relationship between the capacitor C2 and the capacitor C0 in the first thermometer code conversion rule illustrated in (a) of FIG. 2. The fourth thermometer code conversion rule illustrated in FIG. (b) of 13 is to invert the relationship between the capacitor C6 and the capacitor C4 and to invert the relationship between the capacitor C2 and the capacitor C0 in the second thermometer code conversion rule illustrated in (b) of FIG. 2.

The thermometer decoder 133 converts the high-order DAC code to a first high-order DAC thermometer code and a second high-order DAC thermometer code illustrated in FIG. 2 with a relationship in which arrangements of "0" and "1" are point-symmetric with respect to the center bit (corresponding to C3) using the first thermometer code conversion rule and the second thermometer code conversion rule illustrated in FIG. 1.

In addition, the thermometer decoder 133 converts the high-order DAC code to the third high-order DAC thermometer code using the third thermometer code conversion rule illustrated in (a) of FIG. 13. The third high-order DAC thermometer code has values of a high-order bit group which is higher-orders than the center bit of the third high-order DAC thermometer code with a relationship in which arrangements of "0" and "1" are point-symmetric with respect to the center bit (corresponding to C5) of the high-order bit group of the first high-order DAC thermometer code and values of the low-order bit group which are lower-order bits than the center bit of the third high-order DAC thermometer code with a relationship in which arrangements of "0" and "1" are point-symmetric with respect to the center bit (corresponding to C1) of the low-order bit group of the first high-order DAC thermometer code. The thermometer decoder 133 converts the high-order DAC code to the fourth high-order DAC thermometer code using the fourth thermometer code conversion rule illustrated in FIG. 13(b). The fourth high-order DAC thermometer code has values of a high-order bit group which is higher-orders than the center bit of the fourth high-order DAC thermometer code with a relationship in which arrangements of "0" and "1" are point-symmetric with respect to the center bit (corresponding to C5) of the high-order bit group of the second high-order DAC thermometer code and values of the low-order bit group which are lower-order bits than the center bit of the fourth high-order DAC thermometer code with a relationship in which arrangements of "0" and "1" are point-symmetric with respect to the center bit (corresponding to C1) of the low-order bit group of the second high-order DAC thermometer code.

FIG. 14 is a diagram illustrating an example of an integral nonlinear error (INL) in a third decoding method using the third thermometer code conversion rule illustrated in (a) of FIG. 13 and a fourth decoding method using the fourth thermometer code conversion rule illustrated in (b) of FIG. 13.

FIG. 15 is a diagram illustrating an advantage of the successive approximation AD converter 3 and illustrates that the integral nonlinear error decreases by causing the average value calculator 134 to perform an averaging process using when there is the DA conversion element unevenness illustrated in FIGS. 4 and 14.

FIG. 15 illustrates an average waveform of four INL waveforms illustrated in FIGS. 4 and 14. When the horizontal axis is defined as x, the left end is defined as x=−1, and the right end is defined as x=+1, this waveform is point-symmetric with respect to the origin O, point-symmetric with respect to a point of x=−½ in a range of x of −1 to 0, and similarly point-symmetric with respect to a point of x=+½ in a range of x of 0 to +1. This corresponds to performing considering partial waveforms in the range of x of −1 to 0 and in the range of x of 0 to +1 as mixture of a component of an even function and a component of an odd function and cancelling a component of the even function thereof in association with the midpoint in each range for the component of the odd function in the range of x of −1 to +1. That is, the component of the odd function, for example, a third harmonic component, in the range of x of −1 to +1 decreases. Accordingly, according to this embodiment, it is possible to further improve the INL waveform.

The case in which the number of thermometer codes is odd is described above. A case in which the number of thermometer code bits is even will be described below.

FIG. 21 is a diagram illustrating an example of thermometer code conversion rules in this embodiment. FIG. 13 illustrates an example in which the number of thermometer bits is seven and FIG. 21 illustrates an example in which the number of thermometer bits is six. In this embodiment, the thermometer decoder 133 converts a high-order DAC code to different high-order DAC thermometer codes using the first thermometer code conversion rule illustrated in (a) of FIG. 18, the second thermometer code conversion rule illustrated in (b) of FIG. 18, a third thermometer code conversion rule illustrated in (a) of FIG. 21, and a fourth thermometer code conversion rule illustrated in (b) of FIG. 21.

The third thermometer code conversion rule illustrated in (a) of FIG. 21 is to invert the relationship between the capacitor C5 and the capacitor C3 and to invert the relationship between the capacitor C2 and the capacitor C0 in the first thermometer code conversion rule illustrated in (a) of FIG. 18. The fourth thermometer code conversion rule illustrated in (b) of FIG. 21 is to invert the relationship between the capacitor C5 and the capacitor C3 and to invert the relationship between the capacitor C2 and the capacitor C0 in the second thermometer code conversion rule illustrated in (b) of FIG. 18.

The thermometer decoder 133 converts the high-order DAC code to a first high-order DAC thermometer code and a second high-order DAC thermometer code with a relationship in which arrangements of "0" and "1" are point-symmetric with respect to the midpoint (corresponding to a boundary between C2 and C3) of the thermometer code using the first thermometer code conversion rule and the second thermometer code conversion rule illustrated in FIG. 18.

In addition, the thermometer decoder 133 converts the high-order DAC code to a third high-order DAC thermometer code using the third thermometer code conversion rule illustrated in (a) of FIG. 21. The third high-order DAC thermometer code has values of a high-order bit group which is higher-orders than the center bit of the third high-order DAC thermometer code with a relationship in which arrangements of "0" and "1" are point-symmetric with respect to the center bit (corresponding to C4) of the high-order bit group of the first high-order DAC thermometer code and values of the low-order bit group which are lower-order bits than the center bit of the third high-order DAC thermometer code with a relationship in which arrangements of "0" and "1" are point-symmetric with respect to the center bit (corresponding to C1) of the low-order bit group of the first high-order DAC thermometer code. The thermometer decoder 133 converts the high-order DAC code to the fourth high-order DAC thermometer code using the fourth thermometer code conversion rule illustrated in (b) of FIG. 21. The fourth high-order DAC thermometer code has values of a high-order bit group which is higher-orders than the center bit of the fourth high-order DAC thermometer code with a relationship in which arrangements of "0" and "1" are point-symmetric with respect to the center bit (corresponding to C4) of the high-order bit group of the second high-order DAC thermometer code and values of the low-order bit group which are lower-order bits than the center bit of the fourth high-order DAC thermometer code with a relationship in which arrangements of "0" and "1" are point-symmetric with respect to the center bit (corresponding to C1) of the low-order bit group of the second high-order DAC thermometer code.

Whether there is a center bit depends on the number of thermometer bits. When the number of bits to which a conversion rule is applied is odd, there is a center bit. When the number of bits to which the conversion rule is applied is even, there is no center bit and a boundary for dividing the bits equally is used as a midpoint.

When the number of thermometer bits is seven, the number of bits is odd and thus there is a center bit and the number of bits of the high-order bit group and the low-order bit group with respect to the center bit is $(7-1)\div2=3$. Since 3 is an odd number, there is a center bit in switching of the third thermometer code conversion rule and the fourth thermometer code conversion rule.

On the other hand, when the number of thermometer bits is six, the number of bits is even and thus there is no center bit and the number of bits of the high-order bit group and the low-order bit group is $6\div2=3$. Since 3 is an odd number, there is a center bit in switching of the third thermometer code conversion rule and the fourth thermometer code conversion rule.

Figure 22:
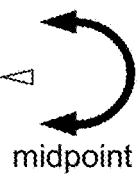
FIG. 22 is a diagram illustrating an example of a thermometer code conversion rule according to an embodiment when the number of thermometer bits is 8.

When the number of thermometer bits is eight, the number of bits is even and thus there is no center bit and the number of bits of the high-order bit group and the low-order bit group is $8\div2=4$. Since 4 is an even number, there is no center bit in switching of the third thermometer code conversion rule and the fourth thermometer code conversion rule and a boundary for dividing four bits of each of the high-order bit group and the low-order bit group equally is used as the midpoint. FIG. 22 is a diagram illustrating an example of thermometer code conversion rules in this embodiment when the number of thermometer codes is 8. The thermometer decoder 133 converts a high-order DAC code to different high-order DAC thermometer codes using the first thermometer code conversion rule illustrated in (a) of FIG. 22, the second thermometer code conversion rule illustrated in (b) of FIG. 22, a third thermometer code conversion rule illustrated in (c) of FIG. 22, and a fourth thermometer code conversion rule illustrated in (d) of FIG. 22.

When the thermometer DA converter is constituted by seven values of three bits, the aforementioned four types of thermometer code conversion rules can be considered and are generated by inverting the decoding methods which are inverse with respect to x=0 additionally at x=½ and x=−½. When the high-order DAC thermometer code is additionally extended to four bits and five bits, further improvement of the INL waveform can be realized by additionally preparing a plurality of decoding methods. In this case, by preparing decoding methods which are symmetric with respect to x=¼, ⅛, . . . , it is possible to decrease more harmonic components.

While the aforementioned embodiments have been described above as representative examples, it is obvious to those skilled in the art that the embodiments can be subjected to various modifications and replacements within the gist and scope of the disclosure. Accordingly, the disclosure should not be construed to be limited by the aforementioned embodiments, and can be subjected to various modifications and changes without departing from the scope of the appended claims.

For example, in the successive approximation AD converter 2 according to the second embodiment, the thermometer decoder 133 may convert a high-order DAC code to different high-order DAC thermometer codes using four types of thermometer code conversion rules in one cycle of AD conversion as described above in the third embodiment. A plurality of constituent blocks in the embodiments may be combined into a single constituent block or one constituent block may be divided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A successive approximation AD converter comprising:
   a comparator that generates a judge signal indicating a result of comparison between an input analog signal and a reference signal;
   a successive approximation register that successively generates a register signal including a first bit signal and a second bit signal based on the judge signal and generates an AD conversion value of the input analog signal;
   a thermometer decoder that switches a plurality of different thermometer code conversion rules and converts the first bit signal to thermometer codes corresponding to the plurality of different thermometer code conversion rules in one cycle of AD conversion;
   a first DA converter that converts the thermometer codes to a first analog signal;
   a second DA converter that converts the second bit signal to a second analog signal;
   a reference signal generator that generates the reference signal based on the first analog signal and the second analog signal; and
   an average value calculator that calculates an average value of the AD conversion values according to the plurality of different thermometer codes,
   wherein at least two of the plurality of different thermometer codes have values in which a high-order bit group and a low-order bit group obtained by dividing total bits of the thermometer codes equally are exchanged.

2. The successive approximation AD converter according to claim 1, wherein the plurality of different thermometer codes has a same value of a center bit in a case that a number of bits of the thermometer codes is odd, and the two thermometer codes have values in which values of the high-order bit group and the low-order bit group with respect to the center bit are exchanged.

3. The successive approximation AD converter according to claim 2, wherein in the case that the number of bits of the thermometer code is odd, the thermometer decoder converts the first bit signal to a first thermometer code and a second thermometer code that have a relationship in which arrangements of "0" and "1" are point-symmetric with respect to the center bit of the thermometer code, and wherein in a case that the number of bits of thermometer code is even, the thermometer decoder converts the first bit signal to a first thermometer code and a second thermometer code that have a relationship in which arrangements of "0" and "1" are point-symmetric with respect to a boundary between the high-order bit group and the low-order bit group.

4. The successive approximation AD converter according to claim 3, wherein in the case that the number of bits of the thermometer code is odd, the thermometer decoder further converts the first bit signal to a third thermometer code and a fourth thermometer code, wherein in the third thermometer code, values of a high-order bit group that are higher orders than a center bit of the third thermometer code have a relationship in which arrangements of "0" and "1" are point-symmetric with respect to a center bit of a high-order bit group of the first thermometer code, and values of a low-order bit group that are lower orders than the center bit of the first thermometer code have a relationship in which arrangements of "0" and "1" are point-symmetric with respect to a center bit of a low-order bit group of the first thermometer code, and wherein in the fourth thermometer code, values of a high-order bit group that are higher orders than a center bit of the fourth thermometer code have a relationship in which arrangements of "0" and "1" are point-symmetric with respect to a center bit of a high-order bit group of the second thermometer code, and values of a low-order bit group that are lower orders than the center bit of the second thermometer code have a relationship in which arrangements of "0" and "1" are point-symmetric with respect to a center bit of a low-order bit group of the second thermometer code.

5. The successive approximation AD converter according to claim 3, wherein in the case that the number of bits of the thermometer code is even, the thermometer decoder further converts the first bit signal to a third thermometer code and a fourth thermometer code, wherein in the third thermometer code, values of a high-order bit group that are higher orders obtained by dividing total bits of the third thermometer code equally have a relationship in which arrangements of "0" and "1" are point-symmetric with respect to a midpoint that equally divides the high-order bit group of the first thermometer code, and values of a low-order bit group that are lower orders obtained by dividing the total bits of the third thermometer code equally have a relationship in which arrangements of "0" and "1" are point-symmetric with respect to a midpoint that equally divides the low-order bit group of the first thermometer code, and wherein in the fourth thermometer code, values of a high-order bit group that are higher orders obtained by dividing total bits of the fourth thermometer code equally have a relationship in which arrangements of "0" and "1" are point-symmetric with respect to a midpoint that equally divides the high-order bit group of the second thermometer code, and values of a low-order bit group that are lower orders obtained by dividing the total bits of the fourth thermometer code equally have a relationship in which arrangements of "0" and "1" are point-symmetric with respect to a midpoint that equally divides the low-order bit group of the second thermometer code.

6. The successive approximation AD converter according to claim 1, wherein the successive approximation register fixes the first bit signal immediately before the thermometer decoder switches the thermometer code conversion rule after the thermometer decoder has switched the thermometer code conversion rule to the first bit signal.

7. The successive approximation AD converter according to claim 6, further comprising a third DA converter that converts a third bit signal to a third analog signal, wherein the successive approximation register successively generates a register signal including the first bit signal, the second bit signal, and the third bit signal based on the judge signal, and wherein the reference signal generator generates the reference signal based on the first analog signal, the second analog signal, and the third analog signal.

8. The successive approximation AD converter according to claim 7, wherein the successive approximation register fixes the third bit signal to zero before the thermometer decoder switches the thermometer code conversion rule, and wherein the successive approximation register fixes the first bit signal and the second bit signal immediately before the thermometer decoder switches the thermometer code conversion rule, and successively generates the third bit signal based on the judge signal after the thermometer decoder has switched the thermometer code conversion rule to the first bit signal and the second bit signal.

* * * * *